US008756031B2

(12) United States Patent
Astigarraga et al.

(10) Patent No.: US 8,756,031 B2
(45) Date of Patent: Jun. 17, 2014

(54) MATCHED FILTER TESTING OF DATA TRANSMISSION CABLES

(75) Inventors: Tara Astigarraga, Tuscon, AZ (US);
Louie A. Dickens, Tucson, AZ (US);
Nancy V. Ryson, Tucson, AZ (US);
Daniel J. Winarski, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 675 days.

(21) Appl. No.: 12/835,690

(22) Filed: Jul. 13, 2010

(65) Prior Publication Data

US 2012/0016618 A1    Jan. 19, 2012

(51) Int. Cl.
*G01R 31/00*    (2006.01)
*G01R 31/02*    (2006.01)

(52) U.S. Cl.
CPC .................................... *G01R 31/021* (2013.01)
USPC ............................................. 702/109; 702/58

(58) Field of Classification Search
CPC ................................ G01R 31/021; H04B 3/46
USPC .......................... 702/109, 124, 190; 340/3.43
See application file for complete search history.

(56) References Cited

U.S. PATENT DOCUMENTS

| | | | |
|---|---|---|---|
| 5,031,178 A | 7/1991 | Hartman | 371/29 |
| 6,278,730 B1 * | 8/2001 | Tsui et al. | 375/224 |
| 6,873,160 B1 | 3/2005 | Eslambolchi et al. | 324/523 |
| 6,934,655 B2 * | 8/2005 | Jones et al. | 702/108 |
| 7,023,218 B1 | 4/2006 | Eslambolchi et al. | 324/523 |
| 7,069,163 B2 * | 6/2006 | Gunther et al. | 702/79 |
| 7,154,975 B1 * | 12/2006 | Bohnke et al. | 375/368 |
| 7,222,255 B1 | 5/2007 | Claessens et al. | 714/4 |
| 7,271,596 B2 * | 9/2007 | Furse et al. | 324/533 |
| 7,358,745 B1 | 4/2008 | Lo et al. | 324/533 |
| 7,415,367 B2 * | 8/2008 | Williams | 702/59 |
| 7,594,009 B2 | 9/2009 | Triulzi et al. | 709/224 |
| 2009/0116498 A1 | 5/2009 | Huang et al. | 370/401 |
| 2011/0313691 A1 * | 12/2011 | Dobson et al. | 702/58 |

FOREIGN PATENT DOCUMENTS

| | | | | |
|---|---|---|---|---|
| EP | 0 543 577 A3 | 11/1992 | | G01M 11/00 |
| EP | 0 691 546 B1 | 8/2002 | | G01R 31/11 |
| EP | 2 124 474 A1 | 11/2009 | | H04Q 11/00 |
| JP | 2002-094542 | 3/2002 | | |
| WO | 01/84746 | 11/2001 | | H04B 10/08 |

OTHER PUBLICATIONS

U.S. Appl. No. 12/561,114, filed Sep. 16, 2009.

* cited by examiner

*Primary Examiner* — John Breene
*Assistant Examiner* — Timothy H Hwang
(74) *Attorney, Agent, or Firm* — Zilka-Kotab, PC (57) ABSTRACT

In one embodiment, a method for testing a cable includes receiving a read-signal profile read at a receiving-end of a cable upon an initial test signal being input to a sending end of the cable, calculating a cross-correlation function between the read-signal profile and a matched filter output, and determining a peak value of the cross-correlation function. In another embodiment, a system includes a device, the device including logic for receiving a read-signal profile read at a receiving-end of the cable upon an initial test signal being input to a sending end of the cable, logic for calculating a cross-correlation function between the read-signal profile and a matched filter output, logic for determining a peak value of the cross-correlation function, and logic for storing the peak value to a computer readable medium. Other methods, systems, and computer program products are also described according to various embodiments.

18 Claims, 7 Drawing Sheets

MATCHED FILTER TESTING OF DATA TRANSMISSION CABLES

BACKGROUND

Computer systems use cabling in order to transmit and receive information between peripherals, systems, users, sensors, etc. This cabling can take on many forms, including Universal Serial Bus (USB), Ethernet, coaxial, optical, etc. When large amounts of data and information is desired to be transmitted between two devices, Ethernet cabling is typically used. For even more data transmission capability, Fibre Channel over Ethernet (FCoE) may be used along with Ethernet cables.

FCoE is a transport protocol that enables Fibre Channel (FC) to be encapsulated and transmitted over Ethernet while being independent of the Ethernet forwarding scheme. FCoE allows seamless integration of Ethernet cabling with existing FC networks, hardware, and management software.

Ethernet is typically deployed in Server farms, data centers, large enterprise users, etc., for Transmission Control Protocol/Internet Protocol (TCP/IP) networks and FC is typically deployed for Storage Area Networks (SANs). FCoE typically can use two types of cables, copper cables and optical cables.

Copper cables for use with FCoE have different characteristics than optical cables for use with FCoE, and selecting which cable type to use in any given installation can be troublesome. For example, it may be difficult to determine whether copper cabling can handle the distance and data throughput required for a specific application. In another example, it may be difficult to determine if the cable itself has gone bad or if another device (such as a router, server, hub, etc.) in series has gone bad as opposed to the cable.

In medium to large sized hardware installations, there can be anywhere from thousands of feet of cables to miles of cables installed. Much of this installed cabling is, sometimes purposely, not easily accessible, e.g., it is behind walls, in ceilings, under floors, in bundles, etc. The purpose behind making this cabling inaccessible is that it is out of the way and does not obstruct other uses of the spaces, where the cabling might be installed and be accessible, along with a reduction in exposure of the cables to environmental factors. Another reason for installing the cabling in inaccessible areas is that the cabling, in many cases, needs to connect two or more remote systems, thereby allowing transmission between those systems, and these connections cannot be made in areas where environmental factors might disrupt, disconnect, or otherwise harm the cables or obstruct normal use of these areas. Note that for FCoE copper cables, they are typically available in 1 m, 3 m, or 5 m lengths and are generally used to connect to Top of Rack FCoE Fibre Channel Forwarders (FCFs). The FCoE copper cables are typically run within the racks and not under floors or behind walls.

Unfortunately, providing cabling in inaccessible or difficult to access areas also prevents maintenance from being performed on the cabling with any relative case. Cables, although not frequently, do fail and become less efficient at data transmission over time. Cables may also become disconnected, terminated, shorted, severed, or otherwise ineffective at transmitting information. In these cases, when a cable is to be tested to determine if it is transmitting information at an acceptable rate, it would be beneficial to have a method and/or system which can test these cables without requiring access to the entire run of the cable.

SUMMARY

In one embodiment, a method for testing a cable includes receiving a read-signal profile read at a receiving-end of a cable upon an initial test signal being input to a sending end of the cable, calculating a cross-correlation function between the read-signal profile and a matched filter output, and determining a peak value of the cross-correlation function.

In another embodiment, a system includes a device for testing integrity of a cable, the device including logic for receiving a read-signal profile read at a receiving-end of the cable upon an initial test signal being input to a sending end of the cable, logic for calculating a cross-correlation function between the read-signal profile and a matched filter output, logic for determining a peak value of the cross-correlation function, and logic for storing the peak value to a computer readable medium.

In yet another embodiment, a computer program product for testing integrity of a cable includes a computer readable storage medium having computer readable program code embodied therewith. The computer readable program code includes computer readable program code configured to receive a read-signal profile read at a receiving-end of a cable upon an initial test signal being input to a sending end of the cable, computer readable program code configured to calculate a cross-correlation function between the read-signal profile and a matched filter output, computer readable program code configured to determine a peak value of the cross-correlation function, computer readable program code configured to compare the peak value to at least one threshold value, and computer readable program code configured to reject the cable if the peak value is less than the threshold value.

Other aspects and embodiments of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

In one general embodiment, a method for testing a cable includes receiving a read-signal profile read at a receiving-end of a cable upon an initial test signal being input to a sending end of the cable, calculating a cross-correlation function between the read-signal profile and a matched filter output, and determining a peak value of the cross-correlation function.

In another general embodiment, a system includes a device for testing integrity of a cable, the device including logic for receiving a read-signal profile read at a receiving-end of the cable upon an initial test signal being input to a sending end of the cable, logic for calculating a cross-correlation function between the read-signal profile and a matched filter output, logic for determining a peak value of the cross-correlation function, and logic for storing the peak value to a computer readable medium.

In yet another general embodiment, a computer program product for testing integrity of a cable includes a computer readable storage medium having computer readable program code embodied therewith. The computer readable program code includes computer readable program code configured to receive a read-signal profile read at a receiving-end of a cable upon an initial test signal being input to a sending end of the cable, computer readable program code configured to calculate a cross-correlation function between the read-signal profile and a matched filter output, computer readable program code configured to determine a peak value of the cross-correlation function, computer readable program code configured to compare the peak value to at least one threshold value, and computer readable program code configured to reject the cable if the peak value is less than the threshold value.

Figure 1:
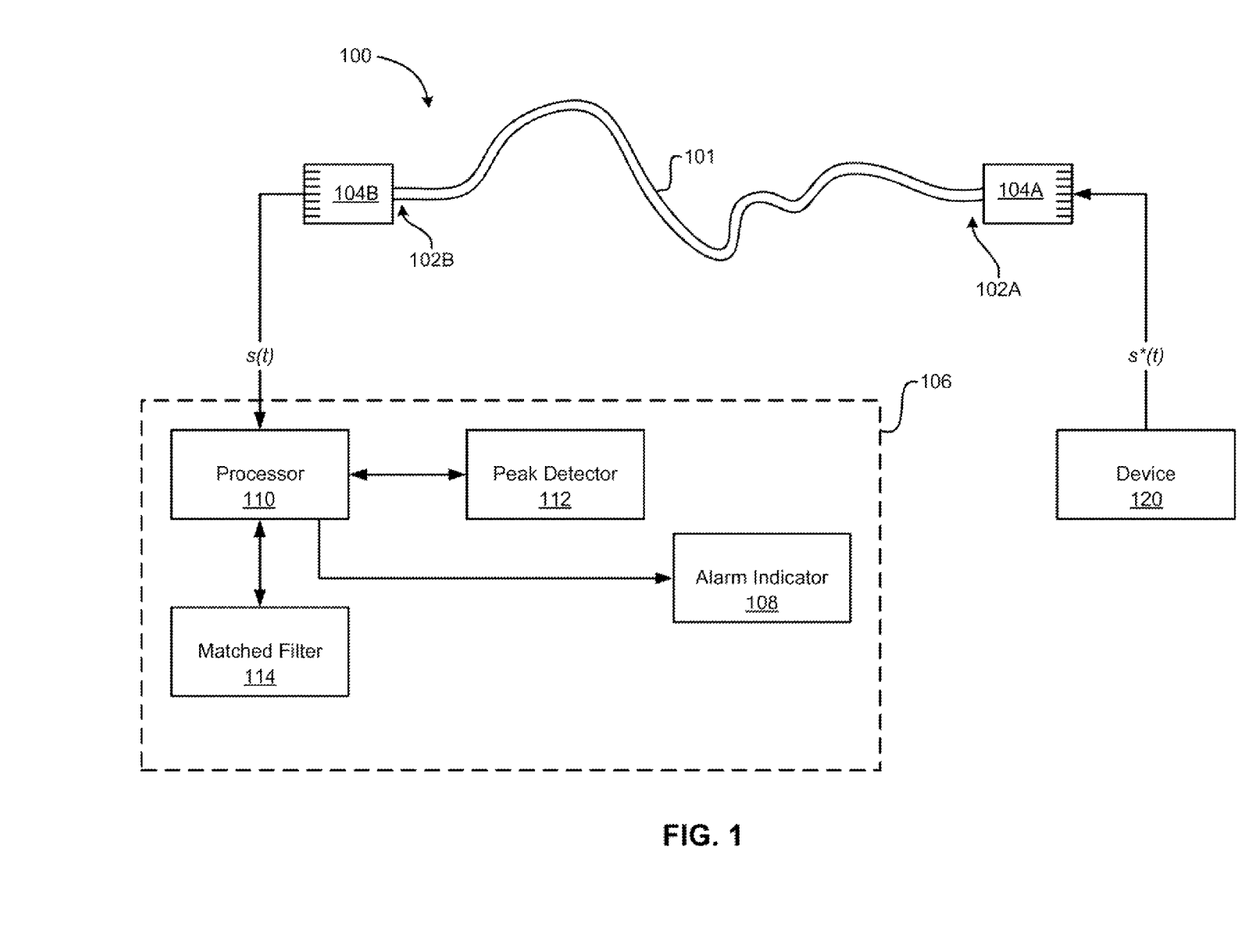
FIG. 1 illustrates a system for testing a cable, according to one embodiment.

Referring to FIG. 1, a system 100 for testing the integrity (including data transmission capabilities, connectivity, etc.) of a cable 101 is shown, according to one embodiment. Note that the system 100, in various embodiments, may have more or less components than those shown. Moreover, the cable 101 is not part of the system 100. The cable 101 has two ends, a first end 102A which sends a signal, and a second end 102B which receives the signal. One or both ends of the cable 102A, 102B may have a connector 104A, 104B, respectively, of any type known in the art, such as small form-factor pluggable (SFP), Mini-Gigabit Interface Connector (Mini-GBIC), Universal Serial Bus (USB) (such as Mini-A, Mini-B, Micro-AB, Micro-B, etc.), RJ45, RJ48, Coaxial, etc., among others. The connectors 104A, 104B may or may not be of the same type for each cable 101. In some embodiments, the cable 101 may be suitable for use in Gigabit Ethernet applications. For example, the cable 101 may be an active copper cable, an optical cable, etc. In some embodiments, the cable 101 may be flexible or highly flexible, shielded or unshielded, comprising a twisted or untwisted pair of wires, etc. The cable 101 may or may not be coupled to a device or system on one or both ends thereof, prior to being tested.

A processor 110, or any other device capable of performing computations, such as an application-specific integrated circuit (ASIC), a field programmable gate array (FPGA), a central processing unit (CPU), etc., may be coupled to the cable 101 and may perform a cross-correlation on the read-signal profile s(t) read at the receiving-end of the cable 102B. The processor 110 may be included in a device 106, such as a switch, router, hub, etc., that may be located at an end of the cable 101 that receives (receiving-end of cable 102B) a test signal s*(t) provided by a device 120 at the other end of the cable 101 (sending-end of the cable 102A). Of course, the processor 110 may be part of another device, system, etc. The device 106 may be part of another system, such as a storage area network (SAN), or may be part of system 100. The processor 110 may perform an analog cross-correlation function y(t), as shown in Equation 1, below, between the read-signal profile s(t) read at the receiving-end of the cable 102B and output of a matched filter 114, which may include an impulse response h(t)=s*(T−t) of the ideal signal profile s*(t):

$$y(j) = \sum_{i=0}^{2M} s(i)h(j-i)$$ Equation 2

In Equation 1, η is an integration variable along the time-axis which may be set to any value, and since h(t) may be used repetitively, it may be calculated once and stored as the matched filter 114 output, in some embodiments. Ideal test signal s*(t) is emitted at the sending-end of the cable 102A, and may be produced by any device 120 known in the art, such as an application designed to produce test signals, a Host Bus Adapter (HBA), a driver, a test apparatus, a switch, etc.

In some embodiments, an integrated or separate peak detector 112 may be used to determine a peak value of the correlation function y(t), as shown in Equation 1.

In another embodiment, an alarm indicator 108 may alert a user, administrator, system, etc., if the peak value is less than a threshold.

Although each of the processor 110, the peak detector 112, the matched filter 114, and the alarm indicator 108 are shown in FIG. 1 as being part of the system 106, one, some, or all of these functions may be apart or absent from the system 106. Additionally, all or some of the functionality of the peak detector 112, the matched filter 114, and/or the alarm indicator 108 may be performed by the processor 110, according to one approach.

Figure 2:
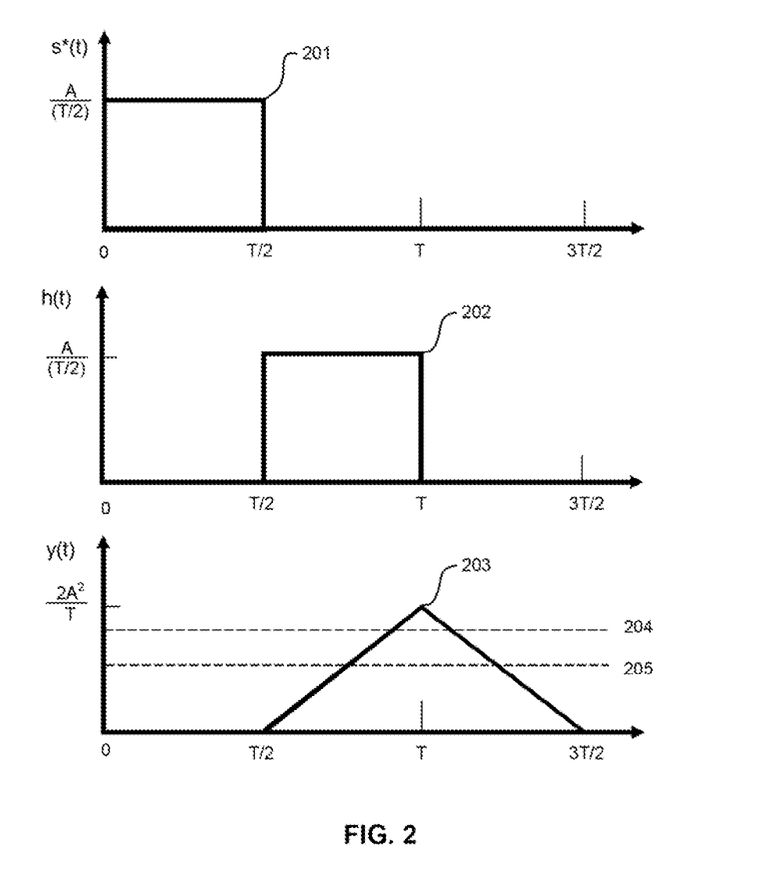
FIGS. 2A-2C are a series of plots illustrating an analog cross-correlation function, according to one embodiment.
Figure 2A:
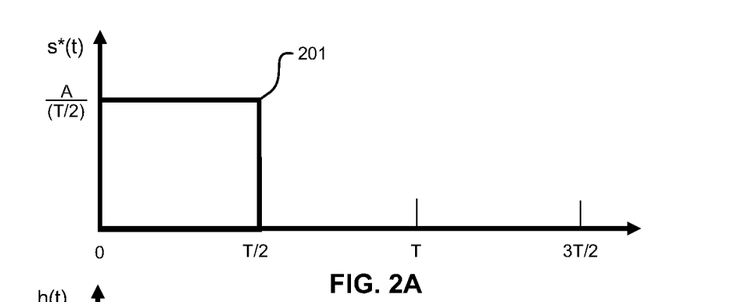
Figure 2B:
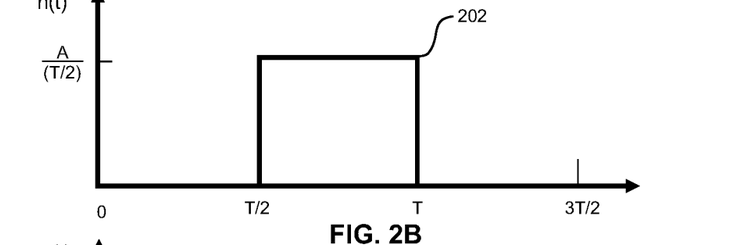
Figure 2C:
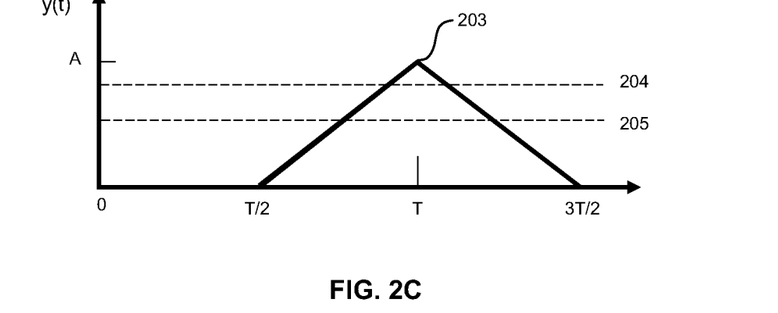

As shown in FIG. 2C, after the cross-correlation has been performed, a peak value 203 of the analog cross-correlation function y(t) is determined. This peak value 203 is an indication of the performance of the cable (FIG. 1, 101), according to some embodiments. In one approach, the peak value (FIG. 2C, 203) may be compared to one or more thresholds 204, 205. Threshold 204 may correspond to a manufacturer's threshold, which may be used to determine if a cable is performing suitably to be shipped or sold. In one embodiment, the manufacturer's threshold may be in a range from about 90% to about 99%, such as about 95%. Threshold 205 may be a user's threshold, which may be a lower threshold than the manufacturer's threshold 204, and may be an indication of when a cable is underperforming and/or is in need of replacement. In one embodiment, the user's threshold may be in a range from about 50% to about 85%, such as about 75%. Of course, many different threshold arrangements are possible as known in the art, such as a single threshold, multiple thresholds (3, 4, 5, etc.), threshold(s) based on importance of cabling, threshold(s) based on frequency of use of cabling, etc. Additionally, if the peak value 203 is below the one or more thresholds 204, 205, an error or alarm message may be sent to a user, administrator, device, system, etc., such that the cable (FIG. 1, 101) may be removed from service if it is already installed in a system, or not installed at all in a new installation, according to various embodiments.

As shown in FIG. 2, a desired peak of the analog cross-correlation function y(t) may be shown as amplitude A. If the ideal signal s*N is a rectangular waveform 201 having a time duration of T/2 and an amplitude of A, and the matched filter output is a time-offset rectangular waveform 202, then the peak of triangular waveform y(t) 203 may be detected (possibly using peak detector 112 in FIG. 1) at a high point of the analog cross-correlation function y(t).

For example, if the analog cross-correlation function y(t) has a peak value (FIG. 2C, 203) below a threshold 205, which, in some approaches, may be a user-selectable percentage of amplitude A, then an error message may be sent to a system administrator that cable (FIG. 1, 101) is not performing properly, e.g., it is time to check the cable 101 to see if (a) it is a copper cable in an installation where an optical cable is more suitable for the task, (b) the length of the cable (length of a single cable or the total cable path length if multiple cables are connected in series) 101 is too long, or (c) the cable 101 is at end-of-life due to corrosion, excessive inserts, degradation, etc., and should be replaced to improve performance of the system.

Referring again to FIGS. 2A-2C, a typical value of T may be in a range from about 0.1 to about 2 nanoseconds, such as about 1 nanosecond, which corresponds to a rate of about 1 Gigabit per second (Gb/s). Ideal signal s*(t) may be repeated no more frequently than time period 2T, so that analog cross-correlation calculations y(t) do not overlap, which would cause them to be indecipherable from one another. This send-receive test may be performed in one direction through the cable (FIG. 1, 101), or in both directions of cable 101, according to various embodiments.

Figure 5:
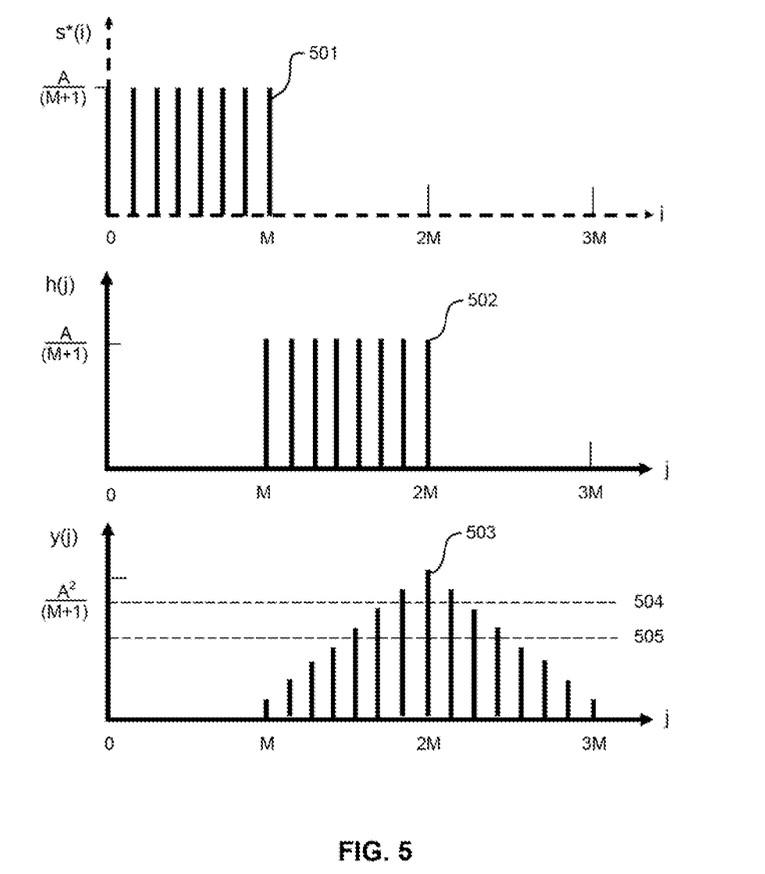
FIGS. 5A-5C are a series of plots illustrating a digital cross-correlation function, according to one embodiment.
Figure 5A:
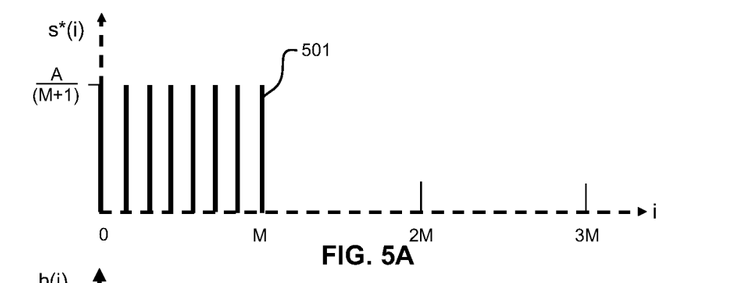
Figure 5B:
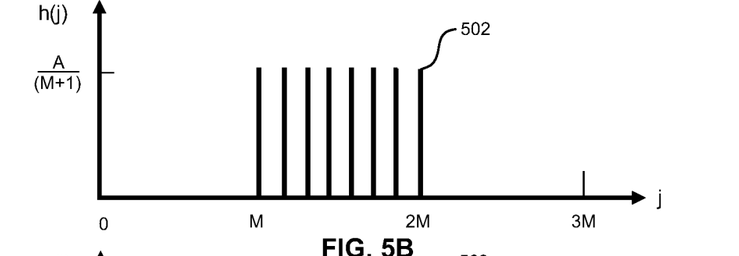
Figure 5C:
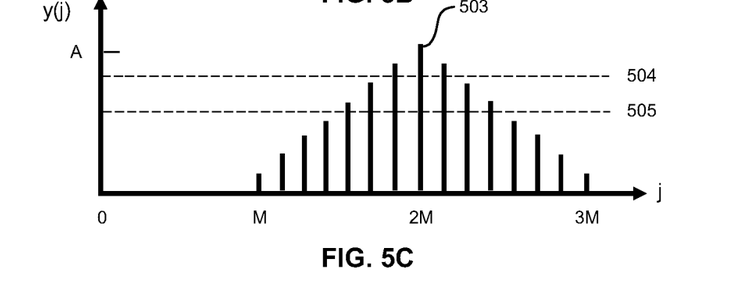

Similar to the analog approach shown in FIGS. 2A-2C, a digital approach may be taken as shown in FIGS. 5A-5C. The cross-correlation may be performed according to Equation 2, below.

$$y(j) = \sum_{i=0}^{2M} s(i)h(j-i)$$

In Equation 2, y(j) is a digital cross-correlation function, s(i) is the received digital signal 501, and h(j−i) is the matched filter output 502. The peak value of digital y(j) 503 is determined, and this peak value 503 is an indication of the performance of the cable, according to some embodiments. In one approach, the peak value 503 may be compared to one or more thresholds 504, 505.

As shown in FIGS. 5A-5C, a desired peak of the digital cross-correlation function y(j) may be shown as amplitude A. If the ideal signal s*(j) is a finite number of discrete digital pulses 501 having a time duration of M and an amplitude of A, and the matched filter output is a time-offset finite number of discrete digital pulses 502, then the peak of y(j) 503 may be detected (possibly using peak detector 112 in FIG. 1) at a high point of the digital cross-correlation function y(j).

Referring again to FIGS. 5A-5C, a typical value of M may be in a range from about 5 to about 20, such as 7, as shown in FIGS. 5A-5C, but may be any number as desired by the programmer. Ideal signal s*(i) may have any number of digital pulses, such as 8 (i=0 to i=7 counts as 8 digital pulses) as shown in FIGS. 5A-5C, but any number may be used. The timing of the signal s*(i) and the matched filter output h(j−i) may be set so that digital cross-correlation calculations y(j) do not overlap, which would cause them to be indecipherable from one another.

Figure 3:
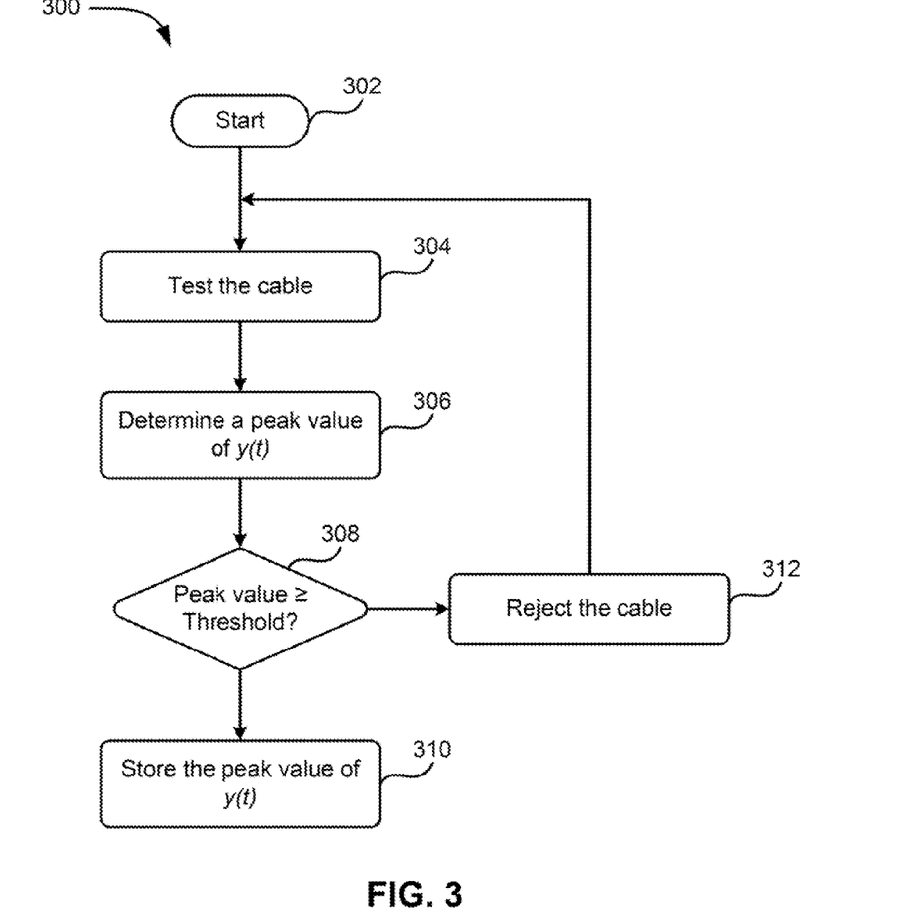
FIG. 3 is a flowchart of a method, according to one embodiment.

Now referring to FIG. 3, a method 300 for testing the integrity of a cable is described according to one embodiment. The method 300 may be carried out in any desired environment, and may include embodiments and/or approaches described in relation to FIGS. 1-2. Of course, more or less operations than those shown in FIG. 3 may be performed as would be known to one of skill in the art.

In operation 302, a system, user, processor, etc., invokes the method 300. Any way of beginning the method 300 may be used as known in the art, such as in response to an event, a calculation, a set of conditions, due to a user action, etc.

In operation 304, testing is performed on a cable. The testing may be performed according to FIGS. 2A-2C and the accompanying descriptions. In one embodiment, a test signal s*(t) is emitted at a sending-end of the cable, which is received at the receiving-end of the cable as an read-signal profile s(t). Cross-correlation function y(t) is performed, as shown in Equation 1, between the read-signal profile s(t) and a matched filter output, in one approach. The matched filter output, in some embodiments, may include an impulse response h(t)=s*(T−t) of the ideal signal profile s*(t). Of course, other cross-correlation functions may be performed, as known to those of skill in the art, such as the digital cross-correlation shown in FIGS. 5A-5C and Equation 2.

Referring again to FIG. 3, in operation 306, a peak value of the cross-correlation function is determined. In one embodiment, this may be performed in accordance with FIGS. 2A-2C, or any other way as known in the art.

Referring again to FIG. 3, in operation 308, it is determined whether the peak value is greater than a threshold. This threshold may be set depending on several factors, such as cable length, cable type, cable material, cable shielding, etc. The threshold may be represented as a percentage of an ideal peak value. The ideal peak value may be equivalent to or a factor of the ideal signal profile s*(t), in some approaches.

In more approaches, the ideal peak value may be established through testing of a plurality of cables manufactured in the same process. For example, fifty 10 meter cables of a single type may be tested, and an average or mean peak value may be established for these fifty cables, excluding peak values lying more than one or two standard deviations from the calculated mean. Then, this mean value may be stored as the ideal peak value for all other testing of these cable types. Of course, many other ways of determining an ideal peak value are possible as known in the art.

In one embodiment, threshold may be in a range from about 75% to about 99%, such as 85%.

In operation 310, the peak value as determined in the testing is stored as a variable indicating the baseline value possible for this cable, as this value will typically only decline over time and usage. The peak value may be stored to a computer readable medium, as described later. This stored baseline value may be used in subsequent testing to compare the present peak value of this particular cable with the baseline value, to determine the amount of degradation that has occurred over time. To determine the present peak value for any cable, the method 300 may be performed again.

In operation 312, if the peak value is less than the threshold, the cable is rejected. In some approaches, the cable may be returned to operation 304 to test the cable again, possibly after performing maintenance on the cable. If a computer is rejecting the cable, it may alert a system administrator, user, system, etc., that the cable has failed the threshold test.

Figure 4:
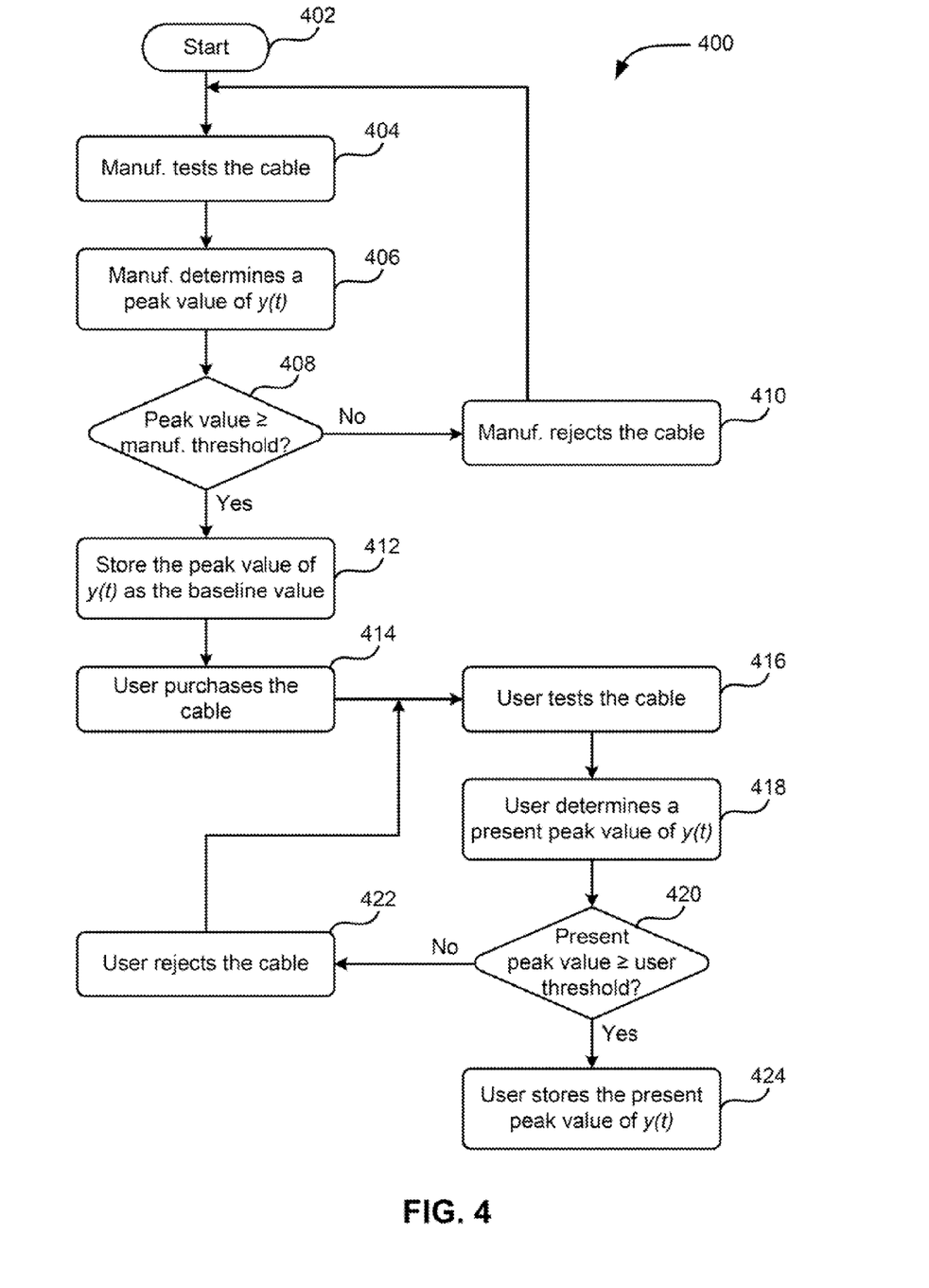
FIG. 4 is a flowchart of a method, according to one embodiment.

In a particular embodiment, as shown in FIG. 4, a method 400 for determining the integrity of a cable is described. The method 400, in some approaches, may combine two instances of method 300 as shown in FIG. 3, possibly performed in different locations and possibly by different entities, such as a manufacturer and a user. The method 400 in FIG. 4 may be carried out in any desired environment, and may include embodiments and/or approaches described in relation to FIGS. 1-3, and FIGS. 5A-5C. Of course, more or less operations than those shown in FIG. 4 may be performed as would be known to one of skill in the art.

In this embodiment, the first calculations and values stored (e.g., cross-correlation function, peak value, threshold value, etc.) are referred to as baseline values, while the second calculations and values stored (e.g., second cross-correlation function, second peak value, second threshold value, etc.) are referred to as present values. This, of course, in no way limits the scope of the invention.

In operation 402, a system, user, processor, etc., invokes the method 400. Any way of beginning the method 400 may be used as known in the art, such as in response to an event (such as the cable being manufactured), a calculation, a set of conditions, due to a user action, etc.

In operation 404, the manufacturer tests the cable. The testing may be performed according to FIGS. 2A-2C and the accompanying descriptions. In one embodiment, a test signal s*(t) is emitted at a sending-end of the cable, which is received at the receiving-end of the cable as an read-signal profile s(t). Cross-correlation function y(t) is performed, as shown in Equation 1, between the read-signal profile s(t) and a matched filter output, in one approach. The matched filter output, in some embodiments, may include an impulse response $h(t)=s^*(T-t)$ of the ideal signal profile $s^*(t)$. Of course, other cross-correlation functions may be performed, as known to those of skill in the art, such as the digital cross-correlation shown in FIGS. 5A-5C and Equation 2.

In operation 406, a peak value of the cross-correlation function is determined. In one embodiment, this may be performed in accordance with FIGS. 2A-2C, or any other way as known in the art.

Referring again to FIG. 4, in operation 408, it is determined whether the peak value is greater than a manufacturer's threshold. This manufacturer's threshold may be set depending on several factors, such as cable length, cable type, cable material, cable shielding, etc. The manufacturer's threshold may be represented as a percentage of an ideal peak value, according to some approaches. In one embodiment, the manufacturer's threshold may be in a range from about 90% to about 99%, such as about 95%.

The ideal peak value may be equivalent to or a factor of the ideal signal profile s*(t), in some approaches. In more approaches, the ideal peak value may be established through testing of a plurality of cables manufactured in the same process. For example, fifty 5 m cables of a single type may be tested, and an average or mean peak value may be established for these fifty cables, excluding peak values lying more than one or two standard deviations from the calculated mean. Then, this mean value may be stored as the ideal peak value for all other testing of these cable types. Of course, many other ways of determining an ideal peak value are possible as known in the art.

In operation 410, if the peak value is below the manufacturer's threshold, the cable is rejected as defective. This rejection simply means that the cable will not be sold or shipped as other cables which pass the testing do. Instead, the cable may be discarded, sold into a secondary market, sold as a lower grade cable, placed back in queue to be retested after conditioning of the cable is performed, etc.

In operation 412, the peak value as determined in the testing is stored as a variable indicating the baseline value possible for this cable, as this value will typically only decline over time and usage. This stored baseline value may be used in subsequent testing to compare the present peak value of this particular cable with the baseline value, to determine the amount of degradation that has occurred over time.

In operation 414, a user purchases the cable which has previously been tested by the manufacturer and provided with a baseline value. The cable may be installed, tested again by the user, put into storage, etc.

At some point, possibly after retrieving the cable from storage, after use of the cable in a system installation, after transferring the cable between entities, etc., the user may desire to test the cable to determine if it is sufficient for the task it is currently performing or may perform in the future.

At this point, in operation 416, the user tests the cable. Testing may be performed as previously described.

In operation 418, a present peak value of the cross-correlation function is determined. This present peak value indicates the current performance of the cable.

In operation 420, it is determined whether the present peak value is greater than a user threshold. The user threshold may be greater than, equal to, or less than the manufacturer's threshold. In one embodiment, the user's threshold may be less than the manufacturer's threshold, as a user may allow for slightly lower performance in order to avoid replacement costs and possible downtime that may be associated with replacing the cable. In one embodiment, the user's threshold may be in a range from about 50% to about 80%, such as about 75%.

In operation 422, the user rejects the cable if it has a present peak value less than the threshold. For example, if the cable is new or recently received, it may be rejected, returned, etc.; if the cable has been in an installation, it may be replaced, maintenance may be performed, etc.; if a computer is rejecting the cable, it may alert a system administrator, user, system, etc., that the cable has failed the threshold test; etc.

In operation 424, the present peak value is stored, possibly in addition to or in place of the baseline value. This allows for reevaluation of the cable to be performed over and over again in the future to determine if the cable should continue to be used in the installation.

In one embodiment, the speed at which cables are tested may be taken into consideration when setting and using threshold values. In one approach, the peak value may be adjusted lower if the cable is first tested at a higher speed and then later at a lower speed. In an alternative approach, the peak value may be adjusted higher if the cable is first tested at a lower speed and then later at a higher speed.

In another approach, a customer may test a cable at two or more different speeds, and may find that the cable functions acceptably at least one of these lower speeds. In this case, the customer may use this cable at the lower speed until it is replaced. The peak value and/or the threshold(s) used for this customer testing do not change from how they are implemented in previous embodiments, the customer just interprets the results differently.

For example, if a manufacturer tests a cable at max speed (e.g., 8 GB FC, 10 GB FCoE, etc.), and sets the peak value, which is then used to determine threshold values (e.g., 90% of peak, 75% of peak, etc.), these values will be provided to the customer for later testing. If the cable has environmental limitations to cable speed (e.g., port speed, storage, etc.), when the customer tests the cable, the speed at which the customer is testing the cable may be taken into account by lowering/raising the peak value before determining the threshold value(s). In other approaches, the thresholds may be raised or lowered, and the peak value may be held the same.

In one example, if a peak value at manufacturer's testing at maximum speed is 100, and if the customer is running the cable at 75% of maximum speed, then a 90% threshold may be set at 67.5 (e.g., 100*(0.75)*(0.9)=67.5), since the peak value may not be reached, or any of the thresholds, since the customer is not running the cable at maximum speed. Likewise, if the manufacturer tests the cable at a slower speed, and the customer is using it at a higher speed, the peak value may be adjusted up before determining the threshold value(s).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), a digital versatile disk (DVD), a Blu-Ray disk (BD), an optical storage device, a magnetic storage device, a solid state device, or any suitable combination of the foregoing. In the context of this document, a computer readable storage medium may be any tangible medium that can contain, or store a program for use by or in connection with an instruction execution system, apparatus, or device.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

For example, in one embodiment, a computer program product for testing integrity of a cable includes a computer readable storage medium having computer readable program code embodied therewith. The computer readable program code includes computer readable program code configured to receive a read-signal profile read at a receiving-end of a cable upon an initial test signal being input to a sending end of the cable, computer readable program code configured to calculate a cross-correlation function between the read-signal profile and a matched filter output, computer readable program code configured to determine a peak value of the cross-correlation function, computer readable program code configured to compare the peak value to at least one threshold value, and computer readable program code configured to reject the cable if the peak value is less than the threshold value.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
receiving a read-signal profile read at a receiving-end of a cable upon an initial test signal being input to a sending end of the cable;
calculating, using a hardware device, a cross-correlation function between the read-signal profile and a matched filter output;
determining a peak value of the cross-correlation function;

comparing the peak value to at least one threshold value; and rejecting the cable when the peak value is less than the at least one threshold value.

2. The method as recited in claim 1, wherein rejecting the cable includes outputting an alert that the cable has failed a threshold test based on the comparing.

3. The method as recited in claim 1, wherein the cross correlation function is:

$$y(t) = \int_0^t s(\eta)h(t-\eta)\,d\eta,$$

where y(t) is the cross-correlation function, s(t) is the read-signal profile, η is an integration variable, and h(t) is the matched filter output.

4. The method as recited in claim 3, wherein the matched filter output includes an impulse response h(t)=s*(T−t).

5. The method as recited in claim 1, wherein the cross correlation function is:

$$y(j) = \sum_{i=0}^{2M} s(i)h(j-i),$$

where y(j) is the cross-correlation function, s(i) is the read-signal profile, and h(i) is the matched filter output, and M is a time duration of an ideal signal.

6. The method as recited in claim 5, wherein the matched filter output includes an impulse response h(j)=s*(2M−j).

7. The method as recited in claim 1, further comprising storing the peak value to a computer readable medium.

8. The method as recited in claim 1, further comprising:
receiving a second read-signal profile read at the receiving-end of the cable upon a second test signal being input to the sending end of the cable;
calculating a second cross-correlation function between the second read-signal profile and the matched filter output;
determining a second peak value of the second cross-correlation function;
comparing the peak value to a first threshold value;
rejecting the cable if the peak value is less than the first threshold value;
comparing the second peak value to a second threshold value; and
rejecting the cable if the second peak value is less than the second threshold value.

9. The method as recited in claim 8, wherein the cross correlation functions are:

$$y(t) = \int_0^t s(\eta)h(t-\eta)\,d\eta,$$

where y(t) is the cross-correlation functions, s(t) is the read-signal profiles, η is an integration variable, and h(t) is the matched filter output.

10. The method as recited in claim 9, wherein the matched filter output includes an impulse response of an ideal signal profile.

11. The method as recited in claim 8, wherein the cross correlation functions are:

$$y(j) = \sum_{i=0}^{2M} s(i)h(j-i),$$

where y(j) is the cross-correlation functions, s(i) is the read-signal profiles, h(i) is the matched filter output and M is a time duration of an ideal signal.

12. The method as recited in claim 11, wherein the matched filter output includes an impulse response.

13. The method as recited in claim 8, wherein calculating the cross-correlation function is performed before the cable is acquired by a user who performs the second cross-correlation function.

14. A system, comprising:
a device comprising:
logic for receiving a read-signal profile read at a receiving-end of the cable upon an initial test signal being input to a sending end of the cable;
a processor for calculating a cross-correlation function between the read-signal profile and a matched filter output;
logic for determining a peak value of the cross-correlation function;
logic for storing the peak value to a computer readable medium,
logic for comparing the peak value to at least one threshold value, and
logic for rejecting the cable when the peak value is less than the at least one threshold value.

15. The system as recited in claim 14, wherein the logic for rejecting the cable includes logic for outputting an alert that the cable has failed a threshold test based on the comparing.

16. The system as recited in claim 14, wherein the cross correlation function is:

$$y(t) = \int_0^t s(\eta)h(t-\eta)\,d\eta,$$

where y(t) is the cross-correlation function, s(t) is the read-signal profile, η is an integration variable, and h(t) is the matched filter output, wherein the matched filter output includes an impulse response.

17. The system as recited in claim 14, wherein the cross correlation function is:

$$y(j) = \sum_{i=0}^{2M} s(i)h(j-i),$$

where y(j) is the cross-correlation function, s(i) is the read-signal profile, and h(i) is the matched filter output, wherein the matched filter output includes an impulse response h(j)=s*(2M−j) where M is a time duration of an ideal signal.

18. A computer program product for testing integrity of a cable, the computer program product comprising:
a non-transitory computer readable storage medium having computer readable program code embodied therewith, the computer readable program code being executable by a processor to:
receive a read-signal profile read at a receiving-end of the cable upon an initial test signal being input to a sending end of the cable;

calculate, by the processor, a cross-correlation function between the read-signal profile and a matched filter output;
determine, by the processor, a peak value of the cross-correlation function;
compare, by the processor, the peak value to at least one threshold value; and
output a rejection, by the processor, of the cable if the peak value is less than the at least one threshold value.

* * * * *